United States Patent
Liu et al.

(10) Patent No.: US 10,372,249 B2
(45) Date of Patent: Aug. 6, 2019

(54) TOUCH SCREEN, FABRICATION METHOD THEREOF, AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Wei Liu, Beijing (CN); Xue Dong, Beijing (CN); Xiaochuan Chen, Beijing (CN); Haisheng Wang, Beijing (CN); Xiaoliang Ding, Beijing (CN); Shengji Yang, Beijing (CN); Yingming Liu, Beijing (CN); Weijie Zhao, Beijing (CN); Hongjuan Liu, Beijing (CN); Changfeng Li, Beijing (CN); Pengpeng Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/529,541

(22) PCT Filed: Oct. 25, 2016

(86) PCT No.: PCT/CN2016/103210
§ 371 (c)(1),
(2) Date: May 25, 2017

(87) PCT Pub. No.: WO2017/084472
PCT Pub. Date: May 26, 2017

(65) Prior Publication Data
US 2018/0356922 A1 Dec. 13, 2018

(30) Foreign Application Priority Data
Nov. 20, 2015 (CN) .......................... 2015 1 0811842

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *H01L 27/323* (2013.01);
(Continued)

(58) Field of Classification Search
CPC ............ H01L 27/3265; H01L 29/4908; H01L 29/78645; H01L 29/78696; H01L 2227/323
See application file for complete search history.

(56) References Cited

U.S. PATENT DOCUMENTS 6,781,293 B2   8/2004  Cho
2005/0110396 A1*  5/2005  Cok .................. H01L 51/529
                                             313/503
(Continued)

FOREIGN PATENT DOCUMENTS

CN       203277508 U    11/2013
KR       20020029715 A   4/2002
KR       101077370 B1   10/2011

OTHER PUBLICATIONS

International Search Report and Written Opinion dated Jan. 26, 2017 in PCT/CN2016/103210.
(Continued)

*Primary Examiner* — Shaheda A Abdin
(74) *Attorney, Agent, or Firm* — Syncoda LLC; Feng Ma

(57) ABSTRACT

The present disclosure provides an in-cell touch screen, a manufacturing method thereof, and a display apparatus. The
(Continued)

touch screen comprises a pixel region disposed over a base substrate. The pixel region is surrounded by a first barrier, which is configured to insulate the pixel region. The pixel region includes a first electrode; a light-emitting layer, disposed over the first electrode; and a second electrode, disposed over the light-emitting layer. The second electrode expands over an opening of the first barrier so as to be able to electrically connect with a third electrode outside the pixel region.

19 Claims, 6 Drawing Sheets

(51) Int. Cl.
    *H01L 51/52*      (2006.01)
    *H01L 27/32*      (2006.01)
    *H01L 51/00*      (2006.01)
    *H01L 51/56*      (2006.01)

(52) U.S. Cl.
    CPC ...... *H01L 27/3246* (2013.01); *H01L 51/0022* (2013.01); *H01L 51/5221* (2013.01); *H01L 51/56* (2013.01); *G06F 2203/04103* (2013.01); *H01L 2227/323* (2013.01)

(56) References Cited

U.S. PATENT DOCUMENTS

| | | | |
|---|---|---|---|
| 2012/0146004 A1* | 6/2012 | Lee | H01L 27/1255 257/40 |
| 2014/0175433 A1* | 6/2014 | Yamazaki | H01L 27/1255 257/43 |
| 2015/0303393 A1 | 10/2015 | Dai et al. | |
| 2017/0003800 A1 | 1/2017 | Zhu | |

OTHER PUBLICATIONS

KIPO Notification of Reason for Refusal dated May 19, 2018 in KR10-2017-7013342.
KIPO Notification of Grant of Patent dated Jul. 31, 2018 in KR10-2017-7013342.

* cited by examiner

TOUCH SCREEN, FABRICATION METHOD THEREOF, AND DISPLAY APPARATUS

CROSS-REFERENCE TO RELATED APPLICATION

The present application claims priority to Chinese Patent Application No. 201510811842.X, filed on Nov. 20, 2015, the disclosure of which is hereby incorporated by reference in its entirety.

TECHNICAL FIELD

The present disclosure relates generally to display technologies, and more specifically to a touch screen, its manufacturing method, and a display apparatus.

BACKGROUND

Organic Light-Emitting Diode (OLED) display panels employ organic materials for light emission, and can have advantages of low operating voltages, fast responses, high luminous efficiency, wide viewing angle, and large operating temperature range, etc. OLED display panels become popular choices for display apparatuses with design objectives of thin and light-weight, low power consumption, and curved or flexible surfaces.

Existing OLED-based touch-control display apparatuses mostly adopt an on-cell structure, such as that as shown in FIG. 1. An OLED display panel 01 and a touch-control panel 02 are manufactured separately, and then bonded together to form a complete touch display apparatus using an adhesive material 03. Separate encapsulations may be needed, and an increased overall thickness may result from this structure.

In-cell touch-control display apparatuses adopt a different structure, where touch-control electrodes are disposed inside the display panel. Film layers may need segmentation and perforation in the fabrication process, and the organic materials used for OLED have more stringent requirements for water and oxygen conditions as compared with other types of materials. Currently, OLED fabrications mostly adopt a vacuum evaporation process, which makes perforation and pattern segmentation difficult and expensive and is thus unfavorable to realize in-cell touch-control OLED apparatuses.

SUMMARY

The present disclosure provides an in-cell touch screen, its manufacturing method and display devices to achieve OLED panel based in-cell touch screen.

In one aspect, a touch screen is disclosed, which comprises a pixel region disposed over a base substrate. The pixel region is surrounded by a first barrier, which is configured to insulate the pixel region. The pixel region includes a first electrode; a light-emitting layer, disposed over the first electrode; and a second electrode, disposed over the light-emitting layer. The second electrode expands over an opening of the first barrier so as to be able to electrically connect with a third electrode outside the pixel region.

In some embodiments of the touch screen, the first barrier has a double-wall structure including a gap arranged therein, and an electrode lead wire is disposed in the gap and is electrically connected with the second electrode over the opening of the first barrier.

In some embodiments of the touch screen, the first barrier can include different portions of different height, and can, for example, include a first portion and a second portion.

A first height of the first portion can be configured to be greater than or equal to a sum of thicknesses of the first electrode, the light-emitting layer, and the second electrode, whereas a second height of the second portion can be configured to be greater than or equal to a sum of thicknesses of the first electrode and the light-emitting layer, but lower than the sum of thicknesses of the first electrode, the light-emitting layer, and the second electrode. The opening is arranged on the second portion.

In some embodiments of the touch screen, the pixel region can further include a plurality of sub-pixel regions, which are each separated and insulated by at least one second barrier. It is configured such that each of the plurality of sub-pixel regions comprises a segment of the first electrode; and that the second electrode is disposed over the plurality of sub-pixel regions and the at least one second barrier.

Each of the at least one second barriers can be configured to have a height greater than or equal to a thickness of the first electrode, but lower than the sum of thicknesses of the first electrode and the light-emitting layer.

Alternatively, each of the at least one second barriers can be configured to have a height greater than or equal to a sum of thicknesses of the first electrode and the light-emitting layer, but lower than the sum of thicknesses of the first electrode, the light-emitting layer, and the second electrode.

In some of the preferred embodiments, the second electrode can be configured to have a reduced parasitic capacitance and an enhanced touch-control capability.

As such, the second electrode can comprise a hollow region and a non-hollow region. Each of the at least one second barriers can include a first part and a second part, which correspond to the hollow region and the non-hollow region respectively, and a height of the first part is greater than a height of the second part.

In some embodiments, the height of the first part can be configured to be greater than or equal to a sum of thicknesses of the first electrode, the light-emitting layer, and the second electrode; whereas the height of the second part can be configured to be greater than or equal to a thickness of the first electrode, and lower than the sum of thicknesses of the first electrode, the light-emitting layer, and the second electrode.

In any of the embodiments of the touch screen as described above, the first electrode can be an anode; the second electrode can be a cathode and a touch-control electrode; the light-emitting layer can comprise at least one organic light-emitting material.

In any of the embodiments of the touch screen as described above, each of the plurality of sub-pixel regions can further include a pixel control circuit, which is disposed between the base substrate and the first electrode.

The touch screen according to any of the embodiments as described above can further comprise a transparent cover, which is disposed over the second electrode.

In a second aspect, the present disclosure further provides a display apparatus, which comprises a touch screen according to any of the embodiments as described above. The display apparatus can be a mobile phone, a tablet computer, a television, a monitor, a notebook computer, a digital picture frame, or a navigation system.

In a third aspect, the present disclosure further provides a method for fabricating the touch screen as described above. The method includes the following steps:

Forming the first electrode and the light-emitting layer over the base substrate; and Forming the second electrode over the light-emitting layer via a solution process.

In some embodiments of the method, the solution process can be inkjet printing.

In some embodiments of the method, the first barrier can be configured to have a double-wall structure including a gap arranged therein, and as such, the step of forming the second electrode over the light-emitting layer via a solution process comprises: simultaneously forming an electrode lead wire in the gap of the double-wall structure, wherein the electrode lead wire is electrically connected with the second electrode over the opening of the first barrier.

In some embodiments, prior to the step of forming the first electrode and the light-emitting layer over the base substrate, the method can further include a step of forming the first barrier over the base substrate. The step of forming the first barrier over the base substrate can comprise a patterning process and an etching process.

Other embodiments and implementations may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments, and the thickness and shape of each film layer in the drawings do not necessarily reflect the real proportions of the structures. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

In one aspect, a touch screen is disclosed, which includes a plurality of pixel regions, disposed over a base substrate. Each pixel region is surrounded by a first barrier, which is configured to insulate the pixel region, and each pixel region includes a first electrode; a light-emitting layer, and a second electrode.

The light-emitting layer is disposed over the first electrode; and the second electrode is disposed over the light-emitting layer. It is configured that the second electrode expands over an opening of the first barrier so as to be able to electrically connect with a third electrode outside the pixel region.

In the touch screen as described above, the first electrode can be an anode, the second electrode can be a cathode and a touch-control electrode, and as such the touch screen can be an in-cell touch screen.

Each pixel region can further include a plurality of sub-pixel regions, which can be, for example, a plurality of electroluminescence sub-pixel regions. The sub-pixel regions are each separated and insulated by at least one second barrier. Each of the plurality of sub-pixel regions is configured to comprise a segment of the first electrode. It is configured such that the second electrode is disposed over the plurality of sub-pixel regions and the at least one second barrier.

Figure 1:
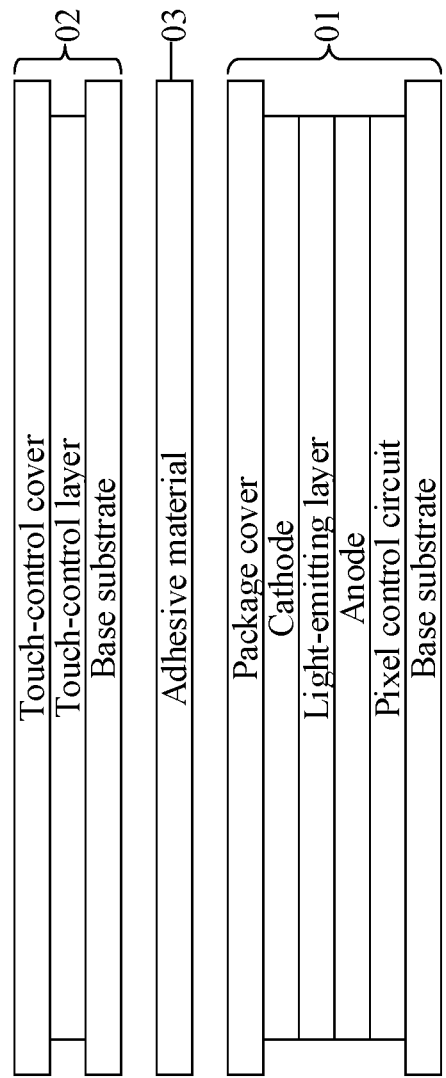
FIG. 1 is a sectional view of a structure of a conventional OLED touch-control display screen.
Figure 2:
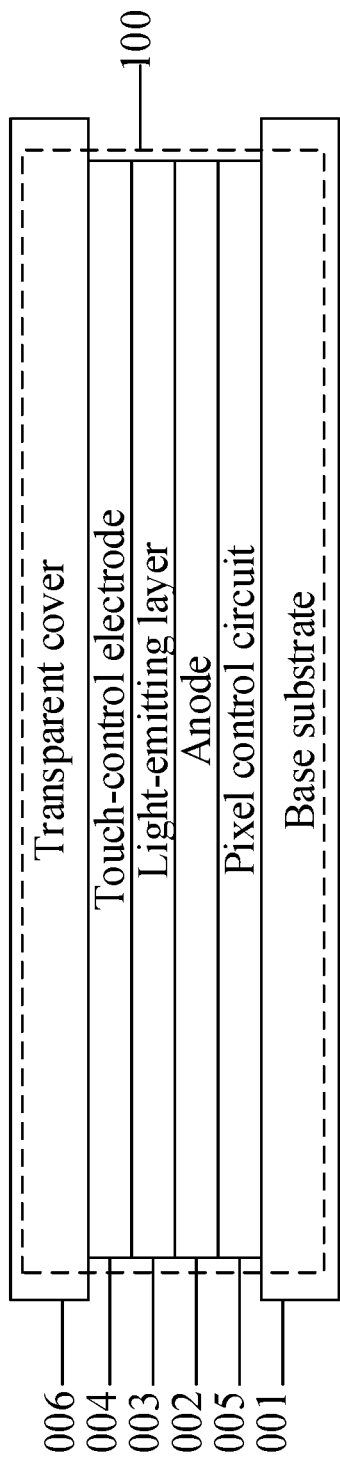
FIG. 2 is a sectional view of a structural of an in-cell touch screen according to some embodiments.

An in-cell touch screen according to some embodiments is illustrated in FIG. 2. The in-cell touch screen comprises a plurality of pixel regions, arranged in a matrix. Each pixel region includes a plurality of electroluminescence sub-pixel regions 100. Only one electroluminescence sub-pixel region 100 is shown in FIG. 2.

Each electroluminescence sub-pixel region 100 comprises an anode 002, and a light-emitting layer 003, disposed over a base substrate 001. The touch screen further comprises a plurality of touch-control electrodes 004, each disposed over the light-emitting layer 003 of all electroluminescence sub-pixel regions 100 in each of the plurality of pixel regions. Each of the touch-control electrodes 004 can also serve as the cathode of each electroluminescence sub-pixel region 100.

The light-emitting layer 003 in the electroluminescence sub-pixel region comprises organic light-emitting materials, and can also include functional film layers such as an electron transport layer, a hole blocking layer, an electron blocking layer, and a hole transport layer, etc.

Through the design according to this embodiment of the disclosure, the cathode can thus be segmented to additionally serve as touch-control electrodes for an OLED panel, to achieve an in-cell touch control. As such, the thickness of the touch-control display apparatus can be reduced, and it also facilitates the designs for thin and light-weight display apparatuses.

To control the light emission of each of the electroluminescence sub-pixel regions to display different images, in the above-described in-cell touch screen, each electroluminescence sub-pixel region 100 as shown in FIG. 2 can also comprise a pixel control circuit 005, disposed between the base substrate 001 and the anode 002.

Because frequent pressing of the screen is needed when used as a touch screen, a transparent cover 006 can be disposed over the touch-control electrode 004. In addition to protecting the screen, the transparent cover 006 can also block water and oxygen from damaging the electroluminescence sub-pixel region 100.

According to some embodiments, inkjet printing can be employed to fabricate the touch-control electrode 004. The inkjet printing process can also be employed to form the anode 002, and the light-emitting layer 003.

Figure 3A:
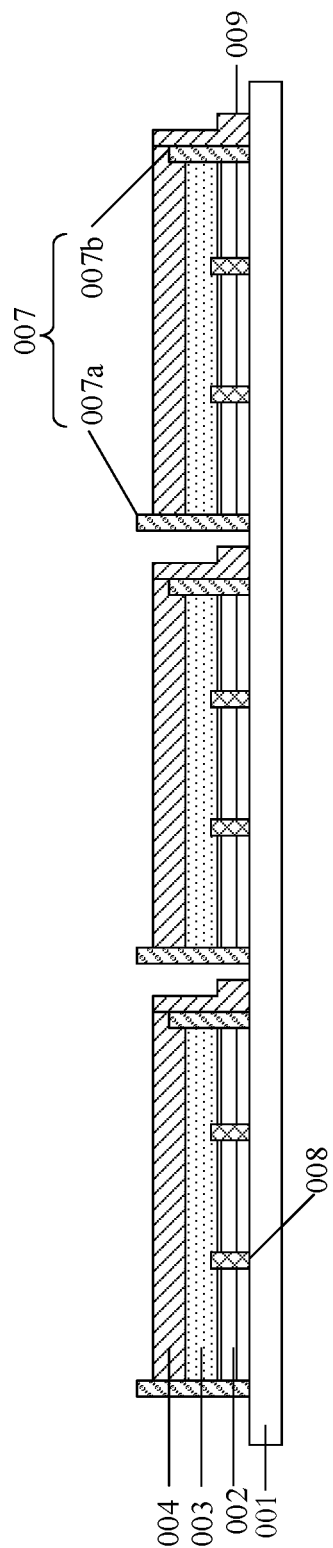
FIG. 3A is a sectional view of a pixel structure of an in-cell touch screen according to some embodiments.

Furthermore, as shown in FIG. 3A and FIG. 3A, to achieve patterned touch-control electrodes 004 using inkjet printing, the in-cell touch screen according to some embodiments of the disclosure can further comprise: a first barrier 007, configured to separate each of the touch-control electrodes 004; and a second barrier 008, configured to separate each electroluminescence sub-pixel region 100 under the same touch-control electrode 004 in each pixel region.

During a manufacturing process according to some embodiments, after completing manufacturing the pixel control circuit 005 over the base substrate 001, the first barrier 007 and the second barrier 008 can be formed first. Next, the anode 002, the light-emitting layer 003, and the touch-control electrode 004 that also serves as a cathode can be sequentially formed using inkjet printing by taking advantage of the different heights of the first barrier 007 and the second barrier 008.

Alternatively, after finishing manufacturing the pixel control circuit 005 and the cathode 002 over the base substrate 001, the first barrier 007 and the second barrier 008 can be formed, and then the light-emitting layer 003 and the touch-control electrode 004 can be sequentially formed using inkjet printing by taking advantage of the different heights of the first barrier 007 and the second barrier 008.

In some embodiments, patterns of the first barrier 007 and the second barrier 008 can be formed using a pattern forming process similar to that used in manufacturing the pixel control circuit 005. Based on the designed thicknesses of the various layers of the anode 002, the light-emitting layer 003, and the cathode, the amount of materials needed can be quantified. An inkjet printing equipment can be configured to print these film layers at a preset accuracy and speed.

Because the functions of each layer are different, and the manufacturing materials are not the same, each layer of can be printed at preset locations according to preset instructions. The number of nozzles in the inkjet printing equipment can be one or more.

Figure 3B:
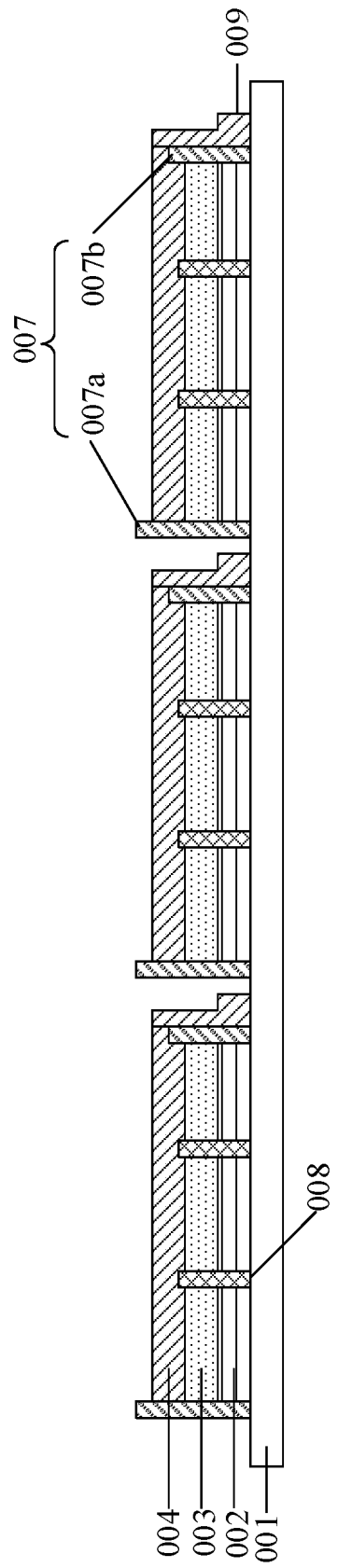
FIG. 3B is a sectional view of a pixel structure an in-cell touch screen according to some other embodiments.

Because the touch-control electrodes 004 are insulated from one another, in order to apply different electrical signals at different time to each of the touch-control electrodes 004, electrode lead wires 009 can be provided and respectively coupled to their corresponding touch-control electrodes 004, as shown in FIG. 3A and FIG. 3B. According to some embodiments disclosed herein, these electrode lead wires 009 can be disposed at the gaps between the touch-control electrodes 004.

To manufacture the electrode lead wires 009 and the touch-control electrodes 004 at the same time, in some embodiments, the first barriers 007, which are disposed at the gaps between the touch-control electrodes 004, can have a double-wall structure with a gap arranged between the double walls of the first barriers 007.

As such, an electrode lead wire 009 can be arranged in a gap of the double-wall structure of one first barrier 007; the electrode lead wire 009 can be connected with a corresponding touch-control electrode 004 at a lower portion of the double-wall structure of the first barrier 007, whereas other portions of the double-wall structure still insulate the electrode lead wire 009 with the two neighboring touch-control electrodes 004. For example, as shown in FIG. 3A and FIG. 3B, the electrode lead wires 009 are each connected to the touch-control electrodes 004 on the left side. In some embodiments, the connections can be made by controlling an amount of ink used at the portions for connections.

In some embodiments as illustrated in FIGS. 3A and 3B, each of the first barriers 007 can be configured to have different heights at different portions to thereby serve different functions. Specifically, each of the first barriers 007 includes a first portion 007a and a second portion 007b, which respectively have a first height and a second height, wherein the first height is greater than the second height.

An electrode lead wire 009 and the corresponding touch-control electrode 004 are electrically connected over the second portion 007b of a first barrier 007. The second height of the second portion 007b is configured to be greater than or equal to a sum of the thicknesses of the anode 002 and the light-emitting layer 003, but lower than a sum of the thicknesses of the anode 002, the touch-control electrode 004, and the light-emitting layer 003.

At the same time, the first height of first portion 007a of the first barrier 007 is configured to be greater than or equal to the sum of the thicknesses of the anode 002, the touch-control electrode 004, and the light-emitting layer 003, so as to prevent the electrode lead wire 009 from electrical coupling to other touch-control electrodes 004, resulting in unwanted electrical connections.

In some embodiments, an OLED display can be realized by employing color filter together with a white light-emitting layer. In this case, the light-emitting layer 003 in each of the electroluminescence sub-pixel regions 100 covered by the same touch-control electrode 004 does not need to be segmented.

For example, the light-emitting layer 003 in each of the electroluminescence sub-pixel regions 100 covered by the same touch-control electrode 004 can be an integral layer, while three different color filters can be included to form three color sub-pixels.

For an integral light-emitting layer 003 as mentioned above, the second barriers 008 can be employed to separate only the anodes 002 of each of the electroluminescence sub-pixel regions 100 covered by the same touch-control electrode 004.

As shown in FIG. 3A, in these embodiments, the height of the second barrier 008 only needs to be no lower than the thickness of the anode 002. Because the anode layer 002 is segmented into a plurality of anodes corresponding to each of the sub-pixels within the same sub-pixel region 100, individual sub-pixel control can still be achieved.

In some other embodiments, the luminescent materials used in electroluminescence sub-pixel regions 100 can be different to thereby emit different colors, e.g., red (R), green (G), and blue (B), within a same sub-pixel region 100. As such, the light-emitting layer 003 in each of the electroluminescence sub-pixel regions 100 covered by the same touch-control electrode 004 can be segmented to avoid color crossing between the R, G, B sub-pixels.

In this case, as shown in FIG. 3B, in addition to separating the anodes 002, the second barriers 008 are also configured to separate the light-emitting layer 003 of each of the electroluminescence sub-pixel regions 100 covered by the same touch-control electrode 004. Therefore, the height of the second barriers 008 can be configured to be greater or equal to the sum of the thickness of the anode 002 and the light-emitting layer 003 according to these embodiments.

To ensure the continuity of the same touch-control electrode 004 that covers each of the electroluminescence sub-pixel regions 100, the height of the second barriers 008 needs to be greater than or equal to the sum of the thicknesses of the anode 002 and the light-emitting layer 003, yet lower than the sum of the thicknesses of the anode 002, the touch-control electrode 004, and the light-emitting layer 003. As such, the touch-control electrode 004 of each of the electroluminescence sub-pixel regions 100 is not segmented by the second barriers 008.

Figure 4:
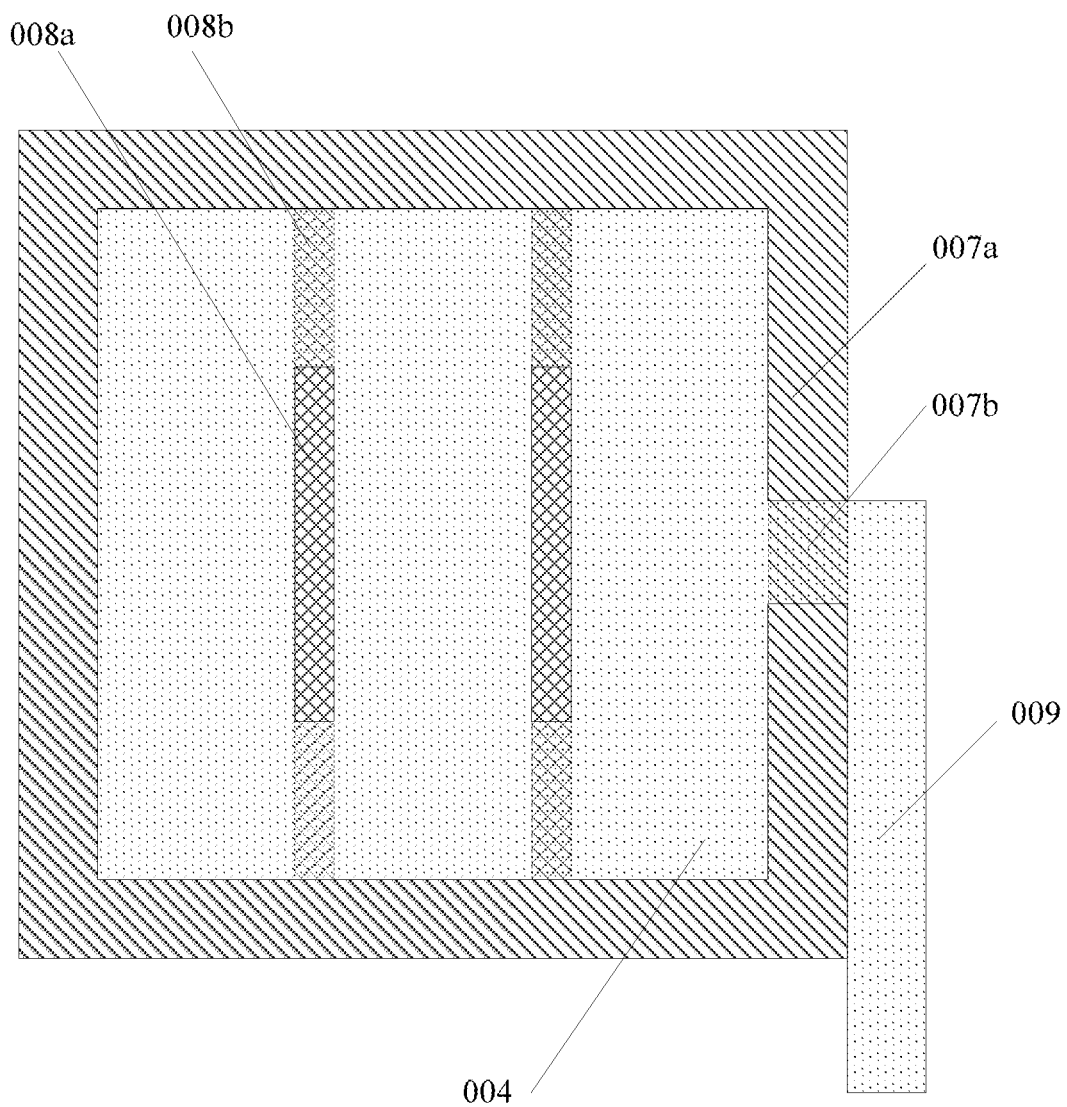
FIG. 4 is a top plan view of a pixel structure of an in-cell touch screen according to some embodiments.

To reduce the parasitic capacitances of the touch-control electrodes 004 and to enhance the touch-control functions, as shown in FIG. 4, cavities or hollow regions can be arranged in the touch-control electrodes 004 in some embodiments of the present disclosure. For example, a hollow region can be arranged in the pattern of each of the touch-control electrodes 004 by utilizing the second barriers 008.

To ensure the continuity of the same touch-control electrode 004, the second barrier 008 can include a first part 008a and a second part 008b, as shown in FIG. 4. The first part 008a of the second barrier 008 has a height greater than a height of the second part 008b of the second barrier 008.

The first part 008a of the second barrier 008 is configured to form the hollow region as mentioned above, which has a height greater than or equal to the sum of the thicknesses of the anode 002, the touch-control electrode 004, and the light-emitting layer 003.

The second part 008b of the second barrier 008 is configured at a non-hollow region, and the height of the second part 008b of the second barrier 008 is configured to be greater than or equal to the thickness of the anode 002, and lower than the sum of the thicknesses of the anode 002, the touch-control electrode 004, and the light-emitting layer 003.

As such, when printing with an inkjet printer at this location, because of the height of the first part 008a of the second barrier 008 and the gravity of the ink solution, the touch-control electrode 004 is not formed at this location, but instead a hollow region is formed, which is occupied by the first part 008a of the second barrier 008.

Because some portion of the conductive touch-control electrode 004 is displaced by the first part 008a of the second barrier 008 that is insulating, a surface area of the touch-control electrode 004 is effectively reduced, which in turn leads to a reduction of a capacitance that is proportional to the surface area.

As such, insulations between the anodes 002 of each of the electroluminescence sub-pixel regions 100 covered by the same touch-control electrode 004 can be achieved, while the touch-control electrode 004 is substantially continuous.

In some embodiments, testing of the touch control can be performed through mutual-capacitance, or self-capacitance.

The shape of the outer contour of each of the touch-control electrode 004 can be shapes different from those examples illustrated in the drawings, and can be rectangle, triangle, or diamond, etc.

In another aspect, a method of manufacturing the above-described in-cell touch screen is provided. The method comprises the following steps:

Forming a first electrode and a light-emitting layer over a base substrate; and

Forming a second electrode over the light-emitting layer via a solution process.

In the above method, the first electrode can be an anode, and the second electrode can a cathode and touch control electrode, and the solution process can be inkjet printing.

Figure 5:
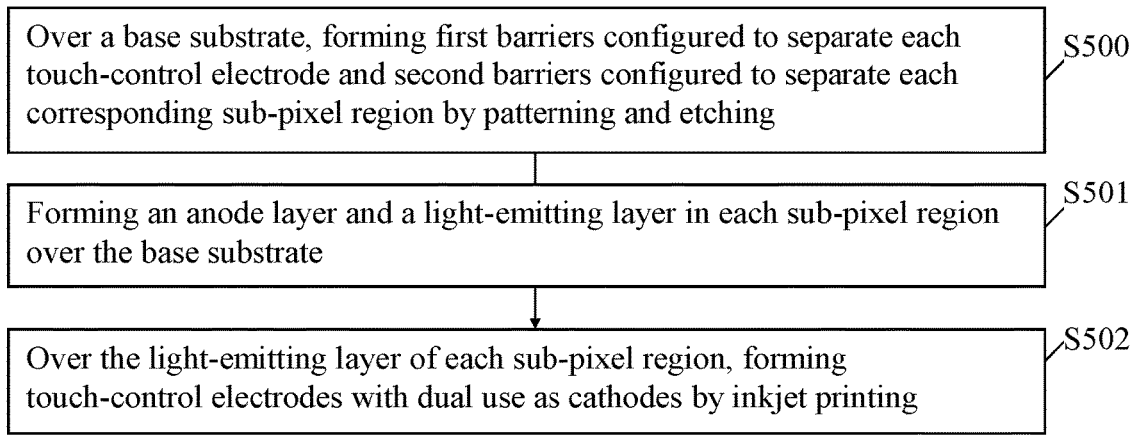
FIG. 5 is a flow chart illustrating a manufacturing process of an in-cell touch screen according to some embodiments.

One embodiment of the method is illustrated in FIG. 5, which includes the following steps.

S501: Forming an anode layer and a light-emitting layer in each of the electroluminescence sub-pixel regions over a base substrate. In some embodiments, an inkjet printing method can be employed to sequentially form an anode layer and a light-emitting layer in each of the electroluminescence sub-pixel regions over the base substrate.

S502: Forming mutually-insulated touch-control electrodes with dual use as cathodes over the light-emitting layer of each electroluminescence sub-pixel region. This step can be carried out using an inkjet printing method, which can effectively simplify the manufacturing process of the in-cell touch screen and reduce manufacturing cost.

In some embodiments, to facilitate forming the patterned film layers by inkjet printing, the method as shown in FIG. 5 can further comprise, prior to executing the step S502, the following step:

S500: Forming a plurality of first barriers configured to separate each of the touch-control electrodes and a plurality of second barriers configured to separate each of the corresponding electroluminescence sub-pixel regions over the base substrate via patterning and etching.

In some embodiments, the plurality of first barriers and the plurality of second barriers can be formed though a one-time patterning and multiple etching processes. The number of etching steps can be related to the specific heights of the first barriers and the second barriers. If the plurality of first barriers and the plurality of second barriers only include two different heights, two etching processes can be employed.

For example, in a non-hollow design for each of the touch-control electrodes 004, the second barriers 008 can be employed to separate the anode 002 and the light-emitting layer 003 of each of the electroluminescence sub-pixel regions 100 covered by the same touch-control electrode 004. The first barriers 007 include two different heights; and the height of the second barriers 008 is the same as the height of the second portions 007b of the first barriers 007 at the connections between the electrode lead wires 009 and the corresponding touch-control electrodes 004.

In another example, each of the touch-control electrodes 004 includes a hollow region. The second barriers 008 are employed to separate the anodes 002 and the light-emitting layers 003 of each of the electroluminescence sub-pixel regions 100 covered by the same touch-control electrode 004. The second barrier 008 is also employed to form the hollow region of the touch-control electrode. As such, the first barriers 007 and the second barriers 008 include two different heights.

The height of the second barriers 008 of the touch-control electrode 004 at the hollow region to be formed, i.e., the height of the first part 008a, can be configured equal to the height of the first portion 007a of the first barriers 007. The height of the second barriers 008 other than the second barriers at the hollow region, i.e., the height of the second part 008b, can be configured equal to the height of the second portion 007b of the first barriers 007.

If the first barriers 007 and second barriers 008 include three different heights, three etching processes can be employed to form the first barriers 007 and the second barriers 008 with three different heights.

For example, each of the touch-control electrodes 004 has a hollow region. The second barriers 008 are employed to separate the anodes 002 of each of the electroluminescence sub-pixel regions 100 covered by the same touch-control electrode 004. The second barriers 008 are also employed to form the hollow regions of the touch-control electrodes 004.

The first barriers 007 and the second barriers 008 each can include two different heights. For example, the height of the first part 008a of the second barriers 008 at the hollow region can be configured to be equal to the height of the first portion 007a of the first barriers 007. The height of the second part 008b of the second barriers 008 can be configured to be equal to the thickness of the anode 002. The height of the second portion 007b of the first barriers 007 can be equal to the sum of the thicknesses of the anode 002 and the light-emitting layer 003.

In some embodiments, the step S500 can be performed prior to the step S501. For example, the first barriers 007 and the second barriers 008 can be formed prior to forming anodes 002 in each of the electroluminescence sub-pixel regions 100, to facilitate a uniform application of an inkjet printer to sequentially form the anode 002, the light-emitting layer 003, and the cathode 004, after forming the first barriers 007 and the second barriers 008.

Alternatively, the step S500 can be performed after forming the anodes 002. In this case, the anodes 002 can be formed by a patterning process and an etching process similar to those employed for forming the first and/or the second barriers. Thereafter, the light-emitting layer and the cathode can be sequentially formed using the inkjet printer.

In some embodiments, prior to performing the step S500, a pixel control circuit 005 can be formed over the base substrate 001 using a conventional patterning process. The patterns of the first barriers and the second barriers can subsequently be formed over the pixel control circuit 005.

In some embodiments, the patterns of the first barriers 007 and the second barriers 008 can be formed using a patterning process similar to that used to manufacture the pixel control circuit 005.

For example, an inkjet printer can be used to print and form these film layers at a preset accuracy. Based on the calculations of the thickness of each layer for the anode 002, the light-emitting layer 003, and the cathode 004, the amount of printing materials needed can be determined.

Because the functions of the layers are configured to be different and the materials used to form them are also configured to be different, printing of each layer at specific locations with designed thicknesses is achieved based on parameters of the inkjet printer. The inkjet printer can employ a single nozzle or a plurality of nozzles.

In some embodiments, in the step S500, the height of the second barrier 008 formed through etching process at the hollow region of the touch-control electrode, i.e., the first part 008a, is greater than the height at other regions, i.e. the second part 008b.

Therefore, when performing the step S502, one or more nozzles of the inkjet printer can be controlled to print preset amounts of liquid, in the region surrounded by the first barrier, based on the location of the desired hollow region of the touch-control electrodes 004 and the heights of the second barriers 008 at different regions.

Thereafter, a drying process can be performed to form the patterns of touch-control electrodes 004 comprising the hollow regions. Because the height of the second barrier at the hollow region of the touch-control electrode, i.e. the first part 008a is greater than its height at other regions, i.e. the second part 008b, the liquid sprayed from the inkjet printer can flow from the greater location at the second barriers to a lower location due to gravity, to thereby form the hollow region.

In some embodiments, in the step S500, the first barriers 007 can have a double-wall barrier structure at locations corresponding to gaps between the touch-control electrodes to be formed.

As such, when the touch-control electrodes 004 are formed in the step S502, the electrode lead wires 009 configured to connect the corresponding touch-control electrodes 004 can be simultaneously formed at the gaps in the double-wall barrier structure of the first barriers 007.

In some embodiments, in the step S500, the height of the second portions 007b of the first barriers 007 can be reduced through an etching process at regions corresponding to the connection between the touch-control electrodes 004 and electrode lead wires 009 to be lower than the height of the first barriers at other regions, e.g., the first portions 007a.

As such, when performing the step S502, the one or more nozzles of the inkjet printer can be controlled to inject a preset amount of liquid inside the region surrounded by the first barriers 007 and at the gap inside the double-wall barrier structure, based on the volume of the regions occupied by each of the touch-control electrodes and the electrode lead wires that need to be formed, and the heights of the first barriers 007 and the second barriers 008 at each region. Thereafter, a drying process can be performed to form the patterns of the touch-control electrodes 004 and the electrode lead wires 009.

An example is provided below to illustrate the methods of forming the first barriers 007 and the second barriers 008. In the example, the height of the second barriers 008 is equal to the height of the second portion 007b of the first barrier 007 at the connection between the electrode lead wires 009 and the corresponding touch-control electrodes 004. The following steps can be performed.

1) Forming a barrier material film layer and a photoresist layer over the base substrate;

2) Exposing and developing the photoresist layer using a mask, so as to form regions in photoresist layer where the photoresist is completely removed, regions where the photoresist is completed retained, and regions where the photoresist is partially retained.

The regions where the photoresist is completely retained correspond to the regions of the first barrier 007 other than those at the connections between the electrode lead wires 009 and the corresponding touch-control electrodes 004; i.e., the regions where the photoresist are completed retained correspond to the first portions 007a of the first barriers 007.

The regions where the photoresist is partially retained corresponds to the regions of the first barrier 007 at the connections between the electrode lead wires 009 and the corresponding touch-control electrodes 004, i.e., the second portions 007b of the first barriers 007, and the regions of the second barriers.

3) Etching away the barrier material film layer at the regions where the photoresist is completely removed, while regions of the barrier material film layer are preserved because of the protection from the photoresist at regions where the photoresist is completely retained and the regions where photoresist is partially retained in the photoresist layer.

4) Thinning the photoresist layer, so as to remove the photoresist layer at the region where photoresist was partially retained and to thin the photoresist layer at the region where photoresist was completely retained.

5) Etching the barrier material film layer at the regions where the photoresist was partially retained to form the patterns of the second barriers 008, and the patterns of the second portions 007b of the first barriers 007 at the connections between the electrode lead wires 009 and the corresponding touch-control electrodes 004, while the remaining regions are protected by the thinned photoresist layer at the regions where the photoresist was completely retained.

6) Stripping away the photoresist layer completely to obtain the patterns of the first portions 007a of the first barriers 007.

In another aspect, a display apparatus is provided comprising the above-described in-cell touch screen. The display apparatus can be a mobile phone, a tablet computer, a television, a monitor, a notebook computer, a digital picture frame, a navigation system or any other products or components with display functions.

In some embodiments, the touch screen is an OLED touch screen. In some other embodiments, the touch screen is a liquid crystal display (LCD) screen, which can also take advantages of the structure and the fabrication method described above.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A touch screen, comprising a pixel region disposed over a base substrate, wherein:
    the pixel region is surrounded by a first barrier, configured to insulate the pixel region; and
    the pixel region comprises:
        a first electrode;
        a light-emitting layer, disposed over the first electrode; and
        a second electrode, disposed over the light-emitting layer;
    wherein:
        the second electrode expands over an opening of the first barrier so as to be able to electrically connect with a third electrode outside the pixel region;
        the first barrier comprises a first portion and a second portion;
    a first height of the first portion is greater than or equal to a sum of thicknesses of the first electrode, the light-emitting layer, and the second electrode;
    a second height of the second portion is greater than or equal to a sum of thicknesses of the first electrode and the light-emitting layer, but lower than the sum of thicknesses of the first electrode, the light-emitting layer, and the second electrode; and
    the opening is arranged on the second portion.

2. The touch screen of claim 1, wherein:
    the first barrier has a double-wall structure including a gap arranged therein; and
    an electrode lead wire is disposed in the gap and is electrically connected with the second electrode over the opening of the first barrier.

3. The touch screen of claim 2, further comprising a transparent cover, disposed over the second electrode.

4. A display apparatus, comprising the touch screen according to claim 1.

5. The display apparatus according to claim 4, wherein the display apparatus is a mobile phone, a tablet computer, a television, a monitor, a notebook computer, a digital picture frame, or a navigation system.

6. A method for fabricating a touch screen according to claim 1, the method comprising:
    forming the first electrode and the light-emitting layer over the base substrate; and
    forming the second electrode over the light-emitting layer via a solution process.

7. The method of claim 6, wherein the solution process is inkjet printing.

8. The method of claim 6, wherein the first barrier has a double-wall structure including a gap arranged therein, and the step of forming the second electrode over the light-emitting layer via a solution process comprises:
    simultaneously forming an electrode lead wire in the gap of the double-wall structure, wherein the electrode lead wire is electrically connected with the second electrode over the opening of the first barrier.

9. The method of claim 6, further comprising, prior to the step of forming the first electrode and the light-emitting layer over the base substrate, a step of:
    forming the first barrier over the base substrate.

10. The method of claim 9, wherein the step of forming the first barrier over the base substrate comprises a patterning process and an etching process.

11. A touch screen, comprising a pixel region disposed over a base substrate, wherein:
    the pixel region is surrounded by a first barrier, configured to insulate the pixel region; and
    the pixel region comprises:
        a first electrode;
        a light-emitting layer, disposed over the first electrode; and
        a second electrode, disposed over the light-emitting layer;
    wherein:
        the second electrode expands over an opening of the first barrier so as to be able to electrically connect with a third electrode outside the pixel region; and
        the pixel region comprises a plurality of sub-pixel regions, separated and insulated by at least one second barrier, configured such that:
    each of the plurality of sub-pixel regions comprises a segment of the first electrode; and
    the second electrode is disposed over the plurality of sub-pixel regions and the at least one second barrier.

12. The touch screen of claim 11, wherein each of the at least one second barriers has a height greater than or equal to a thickness of the first electrode, but lower than the sum of thicknesses of the first electrode and the light-emitting layer.

13. The touch screen of claim 11, wherein each of the at least one second barriers has a height greater than or equal to a sum of thicknesses of the first electrode and the light-emitting layer, but lower than the sum of thicknesses of the first electrode, the light-emitting layer, and the second electrode.

14. The touch screen of claim 11, wherein the second electrode is configured to have a reduced parasitic capacitance and an enhanced touch-control capability.

15. The touch screen of claim 14, wherein:
    the second electrode comprises a hollow region and a non-hollow region; and
    each of the at least one second barriers comprises a first part and a second part, corresponding to the hollow region and the non-hollow region respectively, and a height of the first part is greater than a height of the second part.

16. The touch screen of claim 15, wherein:
    the height of the first part is configured to be greater than or equal to a sum of thicknesses of the first electrode, the light-emitting layer, and the second electrode; and
    the height of the second part is configured to be greater than or equal to a thickness of the first electrode, and lower than the sum of thicknesses of the first electrode, the light-emitting layer, and the second electrode.

17. The touch screen of claim 11, wherein the first electrode is an anode, and the second electrode is a cathode and a touch-control electrode.

18. The touch screen of claim 17, wherein the light-emitting layer comprises at least one organic light-emitting material.

19. The touch screen of claim 11, wherein each of the plurality of sub-pixel regions further comprises a pixel control circuit, disposed between the base substrate and the first electrode.

* * * * *